United States Patent
Song et al.

(10) Patent No.: US 7,821,828 B2
(45) Date of Patent: Oct. 26, 2010

(54) MEMORY DEVICE AND MEMORY DEVICE HEAT TREATMENT METHOD

(75) Inventors: Seung-Hwan Song, Incheon (KR); Jun Jin Kong, Yongin-si (KR); Jae Hong Kim, Seoul (KR); Young Hwan Lee, Suwon-si (KR); Dong Hyuk Chae, Seoul (KR); Tae Hun Kim, Seoul (KR); Kyoung Lae Cho, Yongin-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 166 days.

(21) Appl. No.: 12/219,104

(22) Filed: Jul. 16, 2008

(65) Prior Publication Data

US 2009/0201729 A1 Aug. 13, 2009

(30) Foreign Application Priority Data

Feb. 11, 2008 (KR) .................. 10-2008-0012291

(51) Int. Cl.
*G11C 16/04* (2006.01)
(52) U.S. Cl. ................... 365/185.05; 365/185.02; 365/185.09
(58) Field of Classification Search .......... 365/185.02
See application file for complete search history.

(56) References Cited

U.S. PATENT DOCUMENTS

| 5,515,316 | A | * | 5/1996 | Yamamoto et al. .......... 365/182 |
| 5,978,941 | A | | 11/1999 | Katayama et al. |
| 6,009,033 | A | | 12/1999 | Li et al. |
| 6,255,169 | B1 | | 7/2001 | Li et al. |
| 6,434,038 | B1 | * | 8/2002 | Ohno .......................... 365/145 |
| 6,819,586 | B1 | * | 11/2004 | Anthony et al. ............. 365/171 |
| 7,206,217 | B2 | * | 4/2007 | Ohtsuka et al. ............. 365/154 |
| 7,208,751 | B2 | * | 4/2007 | Ooishi .......................... 257/5 |
| 7,221,579 | B2 | * | 5/2007 | Krusin-Elbaum et al. ... 365/148 |
| 7,423,898 | B2 | * | 9/2008 | Tanizaki et al. ............. 365/148 |
| 7,656,734 | B2 | * | 2/2010 | Thorp et al. ................ 365/211 |
| 2005/0094439 | A1 | | 5/2005 | Tao |
| 2008/0007997 | A1 | | 1/2008 | Sousa |

FOREIGN PATENT DOCUMENTS

| JP | 55022279 A | * | 2/1980 |
| JP | 2006-148044 | | 6/2006 |
| JP | 2006-196650 | | 7/2006 |
| KR | 10-2005-0108987 | | 11/2005 |

OTHER PUBLICATIONS

PCT International Search Report and Written Opinion dated Jun. 10, 2009.

* cited by examiner

*Primary Examiner*—Tan T. Nguyen
(74) *Attorney, Agent, or Firm*—Harness, Dickey & Pierce, P.L.C.

(57) ABSTRACT

A memory device and a memory device heat treatment method are provided. The memory device may include: a non-volatile memory device; one or more heating devices configured to contact with the non-volatile memory device and heat the non-volatile memory device; and a controller configured to control an operation of the one or more heating devices based on operational information of the non-volatile memory device. Through this, it may be possible to improve an available period of the non-volatile memory device.

13 Claims, 4 Drawing Sheets

MEMORY DEVICE AND MEMORY DEVICE HEAT TREATMENT METHOD

PRIORITY STATEMENT

This application claims priority under 35 U.S.C. §119 to Korean Patent Application No. 10-2008-0012291, filed on Feb. 11, 2008, in the Korean Intellectual Property Office (KIPO), the entire contents of which are incorporated herein by reference.

BACKGROUND

1. Field

Example embodiments relate to a memory device heat treatment method, and more particularly, to a memory device that can improve a data retention characteristic of a memory device and a thermal treatment method thereof.

2. Description of Related Art

Currently, a non-volatile semiconductor memory is being widely used as one of various types of storage that can continuously store previously stored information even when power is shut off. A representative example of a non-volatile memory may be a flash memory. In comparison to a conventional Hard Disk Drive (HDD), the size of the flash memory may be small. The flash memory may consume a smaller amount of power and improve a read speed. Currently, a solid state disk (SSD) using a large amount of flash memory is offered as a replacement for the HDD.

Representative examples of the flash memory may include a NAND flash memory, a NOR flash memory, and the like. A NAND scheme and a NOR scheme may be distinguished based on a configuration of a cell array and an operational scheme of the cell array.

The flash memory may include a plurality of memory cells. A single memory cell may store at least one data bit. The single memory cell may include a control gate and a floating gate. An insulator may be inserted between the control gate and the floating gate. The insulator may be inserted between the floating gate and a substrate. A process of storing data in a memory cell of the flash memory may be referred to as a "program". A process of erasing the program or the data may be performed by a hot carrier effect or a Fowler-Nordheim (F-N) tunneling mechanism.

Under a particular bias condition, a channel may be formed in the nearest region to the floating gate, among a substrate region. The channel may be a region that is generated when minority carriers of the substrate region cluster together. It may be possible to control the minority carriers to program data to the memory cell or erase the data from the memory cell.

When a particular bias is applied to a source, a drain, and the control gate of the substrate region, the minority carriers of the channel may move to the floating gate. Representative mechanisms of moving the minority carriers to the floating gate may include the hot-carrier effect and the F-N tunneling mechanisms.

The hot-carrier effect mechanism may move relatively many carriers to the floating gate within a quicker period of time than the F-N tunneling mechanism, whereas the hot-carrier effect mechanism may cause great physical damage to the insulator between the floating gate and the substrate. The F-N tunneling mechanism may cause relatively little damage to the insulator, however, the F-N tunneling mechanism may not disregard the damage occurring when a number of times that data is programmed to and erased from a memory cell is increased.

When carriers are accumulated in the floating gate to thereby form charges, data of the memory cell may be determined from the charges. When the insulator around the floating gate is physically damaged, a carrier leakage path may be formed in the insulator. When charges stored in the floating gate are lost via the leakage path, the data stored in the memory cell may be destroyed. Accordingly, research is being conducted regarding a method that may control or recover the physical damage to the insulator around the floating gate.

SUMMARY

Example embodiments may provide controlling apparatuses and/or methods that may effectively perform a thermal treatment for a non-volatile memory device.

Example embodiments may also provide apparatuses and/or methods that may increase an available period of a non-volatile memory device.

According to example embodiments, an apparatus may include a memory device. The memory device may include: a non-volatile memory device; at least one heating device configured to contact with the non-volatile memory device and heat the non-volatile memory device; and a controller configured to control an operation of the heating device based on operational information of the non-volatile memory device.

According to example embodiments, a method may include a memory device heat treatment method of controlling a heating device contacting with a non-volatile memory device. The memory device heat treatment method may include: counting a number of times the non-volatile memory device is erased and storing the counted number of times; determining whether the counted number of times is greater than or equal to a reference value; controlling the heating device to heat the non-volatile memory device when the counted number of times is greater than or equal to the reference value; and initializing the counted number of times after the heating device heats the non-volatile memory device.

BRIEF DESCRIPTION OF THE DRAWINGS

The above and other features and advantages of example embodiments will become more apparent by describing in detail example embodiments with reference to the attached drawings. The accompanying drawings are intended to depict example embodiments and should not be interpreted to limit the intended scope of the claims. The accompanying drawings are not to be considered as drawn to scale unless explicitly noted.

DETAILED DESCRIPTION OF EXAMPLE EMBODIMENTS

Figure 1:
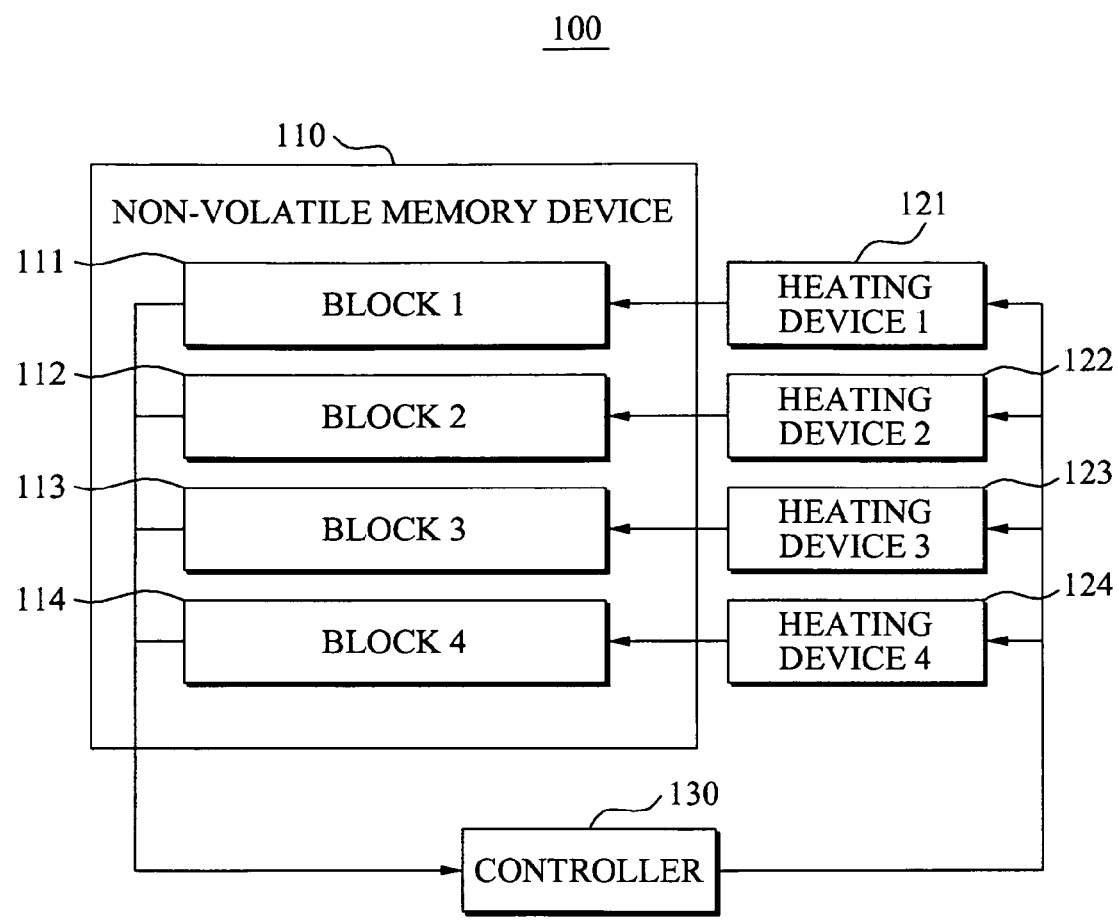
FIG. 1 is a block diagram illustrating a memory device according to example embodiments.

Detailed example embodiments are disclosed herein. However, specific structural and functional details disclosed herein are merely representative for purposes of describing example embodiments. Example embodiments may, however, be embodied in many alternate forms and should not be construed as limited to only the embodiments set forth herein.

Accordingly, while example embodiments are capable of various modifications and alternative forms, embodiments thereof are shown by way of example in the drawings and will herein be described in detail. It should be understood, however, that there is no intent to limit example embodiments to the particular forms disclosed, but to the contrary, example embodiments are to cover all modifications, equivalents, and alternatives falling within the scope of example embodiments. Like numbers refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments. As used herein, the term "and/or" includes any and all combinations of one or more of the associated listed items.

It will be understood that when an element is referred to as being "connected" or "coupled" to another element, it may be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between", "adjacent" versus "directly adjacent", etc.).

The terminology used herein is for the purpose of describing particular embodiments only and is not intended to be limiting of example embodiments. As used herein, the singular forms "a", "an" and "the" are intended to include the plural forms as well, unless the context clearly indicates otherwise. It will be further understood that the terms "comprises", "comprising", "includes" and/or "including", when used herein, specify the presence of stated features, integers, steps, operations, elements, and/or components, but do not preclude the presence or addition of one or more other features, integers, steps, operations, elements, components, and/or groups thereof.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

Spatially relative terms, such as "beneath," "below," "lower," "above," "upper," and the like may be used herein for ease of description to describe the relationship of one component and/or feature to another component and/or feature, or other component(s) and/or feature(s), as illustrated in the drawings. It will be understood that the spatially relative terms are intended to encompass different orientations of the device in use or operation in addition to the orientation depicted in the figures.

Unless otherwise defined, all terms (including technical and scientific terms) used herein have the same meaning as commonly understood by one of ordinary skill in the art to which example embodiments belongs. It will be further understood that terms, such as those defined in commonly used dictionaries, should be interpreted as having a meaning that is consistent with their meaning in the context of the relevant art and should not be interpreted in an idealized or overly formal sense unless expressly so defined herein.

It is known that when heat is appropriately applied around a memory cell, it may be possible to recover from physical damage to an insulator around a floating gate.

An electrical node to store charges corresponding to data stored in a memory cell may be embodied using a nano-crystal, a charge trapping material, a nitride layer, and the like, in addition to the floating gate. The electrical node may also be referred to as a charge storage node.

In the present specification, example embodiments are described based on the floating gate, but example embodiments are not limited thereto. Therefore, it will be apparent to those skilled in the art that example embodiments may be applicable to a memory cell using different types of charge storage nodes, for example, a nano-crystal, a charge trapping material, a nitride layer, and the like FIG. 1 is a block diagram illustrating a memory device 100 according to example embodiments.

Referring to FIG. 1, the memory device 100 may include a non-volatile memory device 110; one or more heating devices, for example, four heating devices including a first heating device 121, a second heating device 122, a third heating device 123, and a fourth heating device 124; and a controller 130. The non-volatile memory device may include one or more blocks, for example, a first block 111, a second block 112, a third block 113, and fourth block 114.

The first heating device 121 may contact with the first block 111 of the non-volatile memory device 110 to thereby heat the first block 111. The second heating device 122 may contact with the second block 112 of the non-volatile memory device 110 to thereby heat the second block 112. The third heating device 123 may contact with the third block 113 of the non-volatile memory device 110 to thereby heat the third block 113. The fourth heating device 124 may contact with the fourth block 114 of the non-volatile memory device 110 to thereby heat the fourth block 114. Though memory device 100 is illustrated as having four blocks and four heating devices, according to example embodiments, memory device 100 may have any number of blocks and any number of heating devices.

The controller 130 may control operations of the first through fourth heating devices 121, 122, 123, and 124, based on operational information of the non-volatile memory device 110.

A process of storing, by the non-volatile memory device 110, data in the first through fourth blocks 111, 112, 113, and 114 may be referred to as a program operation. The program operation may change a threshold voltage of memory cells of the first through fourth blocks 111, 112, 113, and 114. The program operation may be an operation of inserting charges into floating gates of the memory cells, or discharging the charges from the floating gates. Contrary to the program operation, an erase operation may be an operation of discharging the charges from the floating gates, or inserting the charges into the floating gates.

In a conventional non-volatile memory, the program operation may be an operation of inserting charges into floating gates of memory cells to thereby increase threshold voltage of the memory cells. On other hand, the erase operation may be an operation of discharging the charges from the floating gate of the memory cells to thereby decrease the threshold voltage of the memory cells.

The erase operation may initialize the threshold voltage that is increased by the program operation. The program operation may require a relatively longer period of time than a read operation. The erase operation may require a relatively longer period of time than the program operation. Accordingly, the program operation and the erase operation may each be performed simultaneously with respect to a plurality of multi-bit cells.

A set of memory cells where the program operation is simultaneously performed may be referred to as a "page". According to example embodiments, the page may be a set of memory cells connected with a single word line. The non-volatile memory device 110 may apply a particular voltage to the word line connected with the memory cells of the page and adjust the voltage of a bit line of each memory cell of the page to thereby program data in the memory cells of the page.

A set of memory cells where the erase operation is simultaneously performed may be referred to as a "block". According to example embodiments, the block may include a plurality of pages.

Referring to FIG. 1, the first through fourth heating devices 121, 122, 123, and 124 contact with the first through fourth blocks 111, 112, 113, and 114, respectively, to thereby heat each contacting block, but example embodiments are not limited thereto. According to example embodiments, heating devices may contact with pages respectively to thereby heat each contacting page.

Also, according to example embodiments, heating devices may contact with a plurality of non-volatile memory chips, respectively, that are included in a single package to thereby heat each contacting chip.

When storing additional data in a page that stores particular data, it may be preferable for the non-volatile memory device 110 to erase the page storing the particular data prior to programming the additional data.

The erase operation may be performed for each block unit. As described above, since the block may include a plurality of pages, it may be preferable for the non-volatile memory device 110 to erase the block that includes a page where additional data is programmed, prior to programming the additional data.

As the program operation and the erase operation are iterated, an insulating layer surrounding a floating gate may form one or more defects. When the insulating layer has one or more defects, the retention characteristic of data programmed to the memory cell may be degraded.

When the first through fourth heating devices 121, 122, 123, and 124 heat the first through fourth blocks 111, 112, 113, and 114, respectively, insulating layers of the memory cells included in the first through fourth blocks 111, 112, 113, and 114 may be restored, reducing the defects. This has been observed in experiments. The memory device 100 may control the first through fourth heating devices 121, 122, 123, and 124 to heat the first through fourth blocks 111, 112, 113, and 114, respectively, and thereby restore the degraded retention characteristic of the memory cells to an original state before iterating the program operation and the erase operation, or to a level similar to the previous state.

The controller 130 may control the operations of the first through fourth heating devices 121, 122, 123, and 124 based on operational information. The operational information may be a number of times that each of the first through fourth blocks 111, 112, 113, and 114 is erased.

The controller 130 may control the operations of any or all of the one or more heating devices which may be included in memory device 100 based on the number of times corresponding blocks from among the one or more blocks which may be included in non-volatile memory device 110 are erased. For example, the controller 130 may store a number of times the first block 111 is erased and increase the stored number of times every time the first block 111 is erased. When the number of times is greater than or equal to a reference value, the controller 130 may control the first heating device 121 to heat the first block 111. When the first heating device 121 heats the first block 111, the program and erase characteristic of the first block 111 may be restored. Therefore, the controller 130 may initialize the stored number of times that the first block 111 is erased. The reference value representing the number of times that the first block 111 is erased before the first block 111 is heated may be predetermined based on experiments.

The controller 130 may control the operations of any or all of the one or more heating devices which may be included in memory device 100 based on a monitored threshold voltage of corresponding blocks from among the one or more blocks which may be included in non-volatile memory device 110. For example, the controller 130 may monitor a change in a threshold voltage of a memory cell of the second block 112. Operational information may be information associated with the change in the threshold voltage of the memory cell of the second block 112. The controller 130 may generate the operational information from the monitored change in the threshold voltage of the memory cell of the second block 112. When the monitored change in the threshold voltage of the memory cell of the second block 112 is greater than or equal to the reference value, the controller 130 may control the second heating device 122 to heat the second block 112.

The controller 130 may control the operations of any or all of the one or more heating devices which may be included in memory device 100 based on an error rate of error control codes (ECC) decoding for data read from corresponding blocks from among the one or more blocks which may be included in non-volatile memory device 110. For example, the controller 130 may read data from the third block 113 and perform ECC decoding for the read data. It is assumed that the ECC decoding may identify a number of errors in the read data. The controller 130 may generate the operational information from an error rate of the ECC decoded data. The operational information may be information associated with the error rate of the ECC decoded data. When the operational information is greater than or equal to the reference value, the controller 130 may control the third heating device 123 to heat the third block 113.

The controller 130 may control the heating temperatures and durations of any or all of the one or more heating devices which may be included in memory device 100. For example, the controller 130 may control the fourth heating device 124 to heat the fourth block 114 based on the operational information. The fourth heating device 124 may heat the fourth block 114 during a period of time of three hours or less at a particular temperature. The particular temperature may be within the range of 50° C. through 300° C. The fourth heating device 124 may heat the fourth block 114 during a longer period of time than three hours at a temperature of less than 50° C. Conversely, the fourth heating device 124 may heat the fourth block 114 during a shorter period of time than three hours at a temperature greater than 300° C.

The controller 130 may control the operations of any or all of the one or more heating devices which may be included in memory device 100 based on the number times the power to the corresponding blocks from among the one or more blocks included in non-volatile memory device 110 is shut off and reapplied. For example, the controller 130 may monitor and store a number of times the power of the fourth block 114 is shut off and then reapplied. When the power of the fourth block 114 is shut off and then reapplied a predetermined number of times, the controller 130 may control the fourth heating device 124 to heat the fourth block 114. When the fourth heating device 124 heats the fourth block 114, the controller 130 may reset the stored number of times that the power of the fourth block 114 is shut off and then reapplied.

The controller 130 may control the heating duration of any or all of the one or more heating devices which may be included in memory device 100 based on time information received from a timer. For example, according to example embodiments, the controller 130 may receive time information from a timer (not shown) and control the fourth heating device 124 to heat the fourth block 114 for a predetermined time based on the time information.

The heating first device 121 may be an optical device that transfers heat to the first block 111. The first heating device 121 may convert light to heat and transfer the heat to the first block 111.

The second heating device 122 may be a carbon nanotube that generates heat due to an electrical current. According to example embodiments the carbon nanotube may be attached onto a package of the non-volatile memory device 110.

The carbon nanotube may be a lighter material than a conventional metal and may also have a greater strength than the conventional metal. The carbon nanotube may be more readily processed than the conventional metal.

According to example embodiments, the third heating device 123 may be a device that collects sunlight to convert the collected sunlight to heat. The device of converting sunlight to heat may be used for the non-volatile memory device 110 that is installed in a satellite, an airplane, and the like.

According to example embodiments, the fourth heating device 124 may be a device that supplies fluids, for example hot water and the like.

According to example embodiments, the one or more heating devices which may be included in memory device 100 may be any combination of the optical devices, carbon nanotubes, sunlight collecting devices, and heating devices that use fluids that are described above. According to example embodiments all of the one or more heating devices which may be included in memory device 100 may be the same. For example, all of the one or more heating devices which may be included in memory device 100 may be optical devices, carbon nanotubes, sunlight collecting devices, or heating devices that use fluids as described above.

Figure 2:
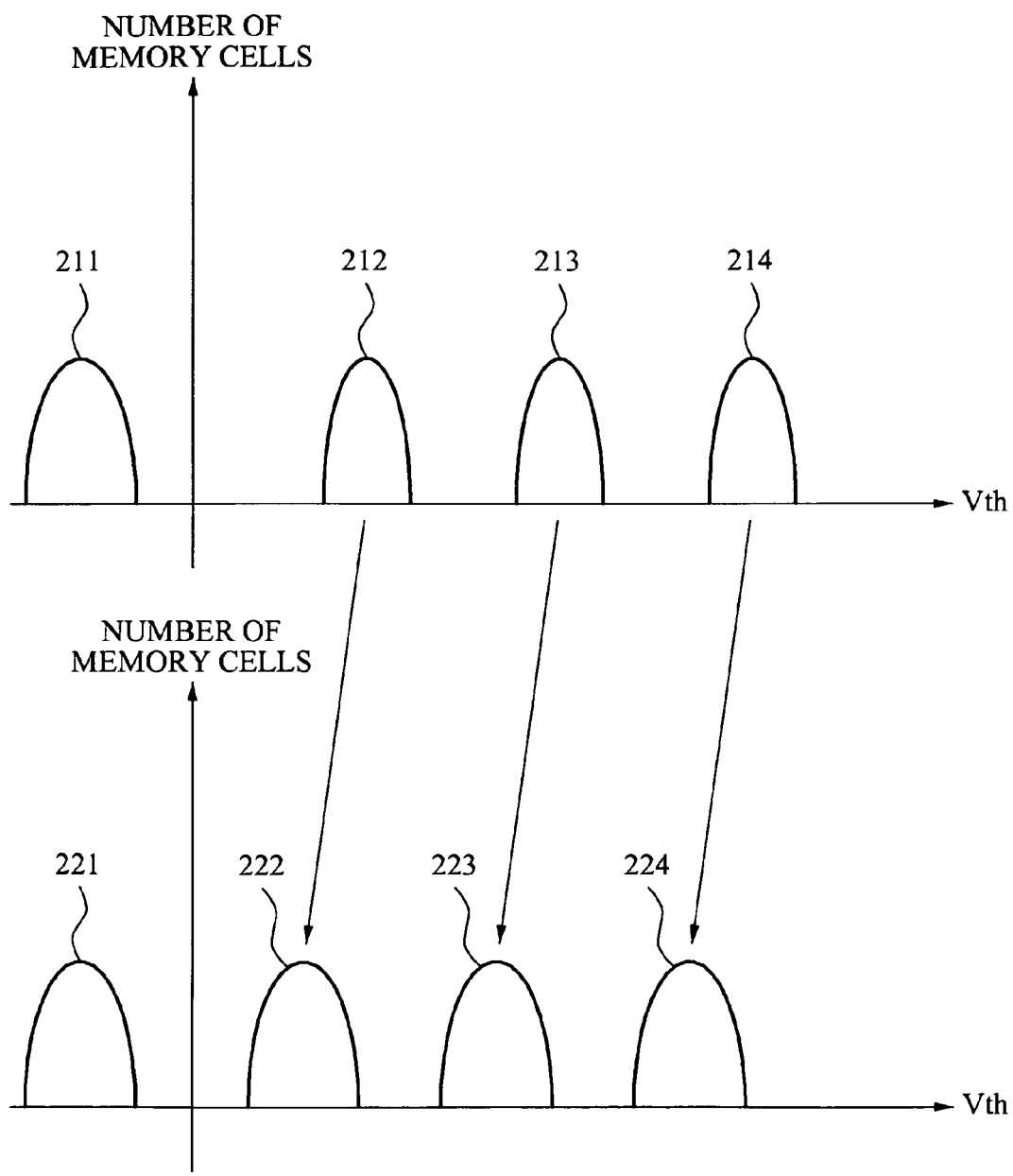
FIG. 2 illustrates a change in a threshold voltage after programming of a memory cell when a number of programs and a number of erases are greater than or equal to a critical value according to example embodiments.

FIG. 2 illustrates a change in a threshold voltage after programming of a memory cell when a number of programs and a number of erases are greater than or equal to a critical value according to example embodiments.

Referring to FIG. 2, the horizontal axis indicates the threshold voltage of the memory cell and the vertical axis indicates a number of memory cells that have a corresponding threshold voltage.

A process of storing data in the memory cell may be performed by converting the threshold voltage of the memory cell. Since each memory cell has a minutely different electrical characteristic, changing the threshold voltage of the memory cells may form a distribution state with a certain width.

The distribution state may be referred to as a "threshold voltage state". Generally, a single threshold voltage state may correspond to a single data value.

A threshold voltage state 211 may correspond to data "11".

A threshold voltage state 212 may correspond to data "10" immediately after programming.

A threshold voltage state 213 may correspond to data "00" immediately after programming.

A threshold voltage state 214 may correspond to data "01" immediately after programming.

The memory cell shown in FIG. 2 may be included in a non-volatile memory device (not shown) when a number of times that the memory cell is erased is greater than or equal to the reference value.

When the number of times that the memory cell is erased is greater than or equal to the reference value, the memory cell of the non-volatile memory device may have a degraded data retention characteristic. Due to a charge leakage path that may be formed on an insulating layer around a floating gate of the memory cell, charges inserted into the floating gate may be discharged over time.

A threshold voltage state 221 may correspond to data "11" after a sufficient period of time is elapsed.

A threshold voltage state 222 may correspond to data "10" after a sufficient period of time is elapsed.

A threshold voltage state 223 may correspond to data "00" after a sufficient period of time is elapsed.

A threshold voltage state 224 may correspond to data "01" after a sufficient period of time is elapsed.

When charges inserted into the floating gate of the memory cell are discharged over time after programming, the threshold voltage of the memory cell may be decreased over time after programming.

When the threshold voltage of the memory cell is decreased over time, the width of threshold voltage states may be increased, which may result in corrupting the stored data.

A memory device according to example embodiments may restore the degraded data retention characteristic which may prevent corruption of data.

Figure 3:
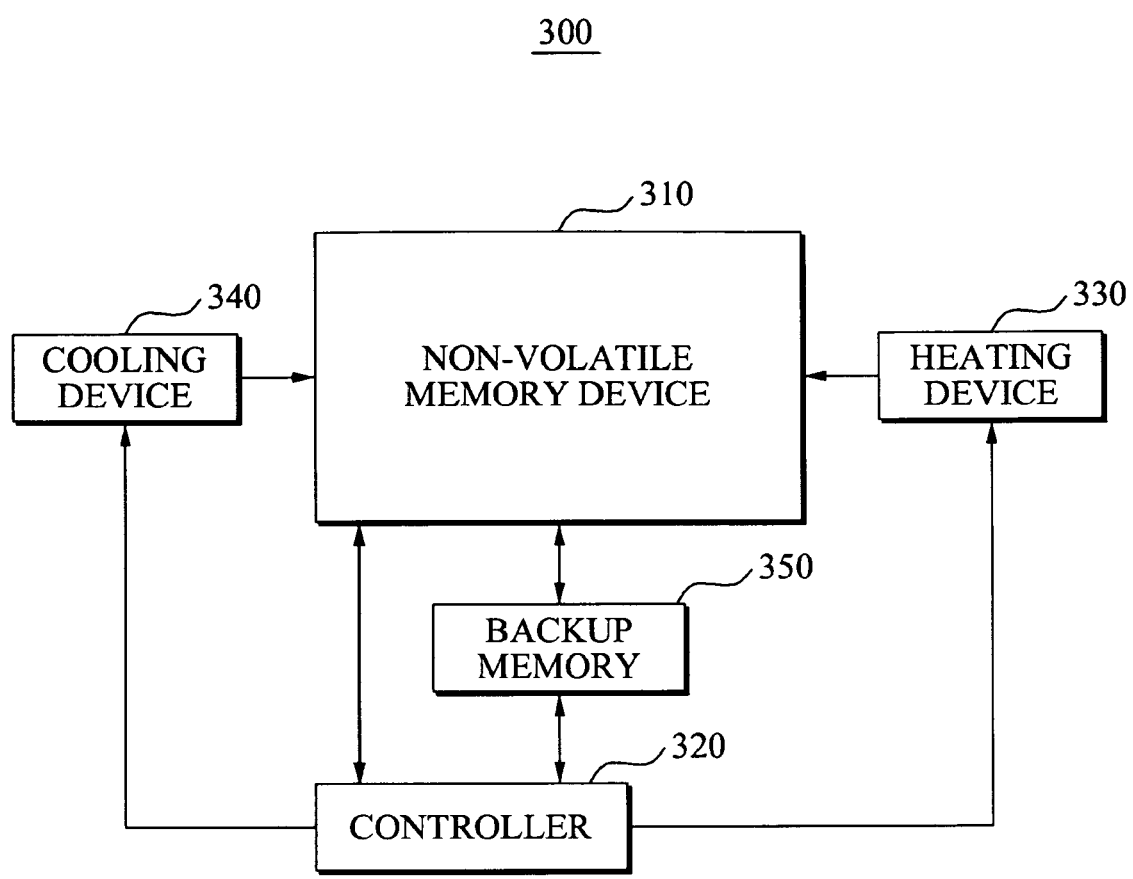
FIG. 3 is a block diagram illustrating a memory device according to example embodiments.

FIG. 3 is a block diagram illustrating a memory device 300 according to example embodiments.

Referring to FIG. 3, the memory device 300 may include a non-volatile memory device 310, a controller 320, a heating device 330, a cooling device 340, and a backup memory 350.

The heating device 330 may contact with the non-volatile memory device 310 to thereby heat the non-volatile memory device 310.

The cooling device 340 may contact with the non-volatile memory device 310 and cool the non-volatile memory device 310.

The controller 320 may control operations of the heating device 330 and the cooling device 340 based on operational information of the non-volatile memory device 310.

The controller 320 may cause data stored in the non-volatile memory device 310 to be backed up in the backup memory 350 before the heating device 330 heats the non-volatile memory device 310.

The controller 320 may shut off the operation of the cooling device 340 based on the operational information of the non-volatile memory device 310. The controller 320 may cut off the operation of the cooling device 340 and control the heating device 330 to heat the non-volatile memory device 310.

The cooling device 340 may be a heat-radiating plate of the package where the non-voltage memory device 310 is installed.

Figure 4:
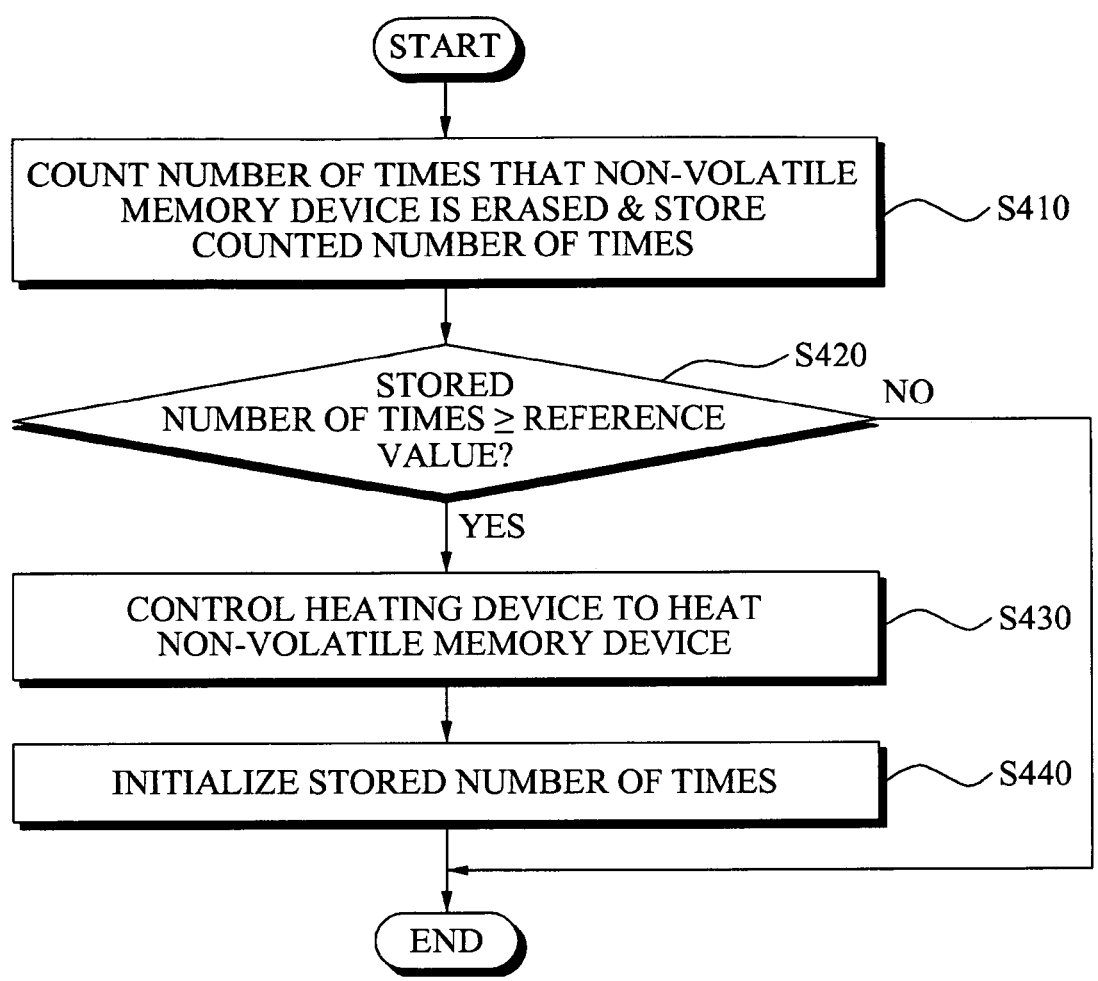
FIG. 4 is a flowchart illustrating a memory heat treatment method of controlling a heating device contacting with a non-volatile memory device according to example embodiments.

FIG. 4 is a flowchart illustrating a memory device heat treatment method of controlling a heating device contacting with a non-volatile memory device according to example embodiments.

Referring to FIG. 4, in operation S410, the memory device heat treatment method may include counting a number of times that the non-volatile memory device is erased and storing the counted number of times.

In operation S420, the memory device heat treatment method may include determining whether the stored number of times is greater than or equal to a reference value.

In operation S430, the memory device heat treatment method may include, controlling the heating device to heat the non-volatile memory device when it is determined the stored number of times is greater than or equal to the reference value.

In operation S440, the memory device heat treatment method may include initializing the stored number of times after the heating device heats the non-volatile memory device.

The memory device heat treatment method may include monitoring a change in a threshold voltage of memory cells of the non-volatile memory device. The memory device heat treatment method may include setting a reference value based on the monitored change in the threshold voltage of the memory cells. According to example embodiments, the reference value may be pre-set based on statistics associated with a relation between the number of times that the non-volatile memory device is erased and the change in the threshold voltage of the memory cells.

The memory device heat treatment method may be those specially designed and constructed for the purposes of example embodiments, or they may be of the kind well-known and available to those having skill in the computer software arts. Examples of computer-readable media may include, for example, magnetic media, for example hard disks, floppy disks, and magnetic tape; optical media, for example, CD ROM disks and DVD; magneto-optical media, for example optical disks; and hardware devices that are specially configured to store and perform program instructions, for example read-only memory (ROM), random access memory (RAM), flash memory, and the like. Examples of program instructions may include both machine code, for example produced by a compiler, and files containing higher level code that may be executed by the computer using an interpreter. The described hardware devices may be configured to act as one or more software modules in order to perform the operations of example embodiments.

Flash memory devices and/or memory controllers according to example embodiments may be embodied using various types of packages. For example, the flash memory devices and/or memory controllers may be embodied using packages including, for example, Package on Packages (PoPs), Ball Grid Arrays (BGAs), Chip Scale Packages (CSPs), Plastic Leaded Chip Carrier (PLCC), Plastic Dual In-Line Package (PDIP), Die in Waffle Pack, Die in Wafer Form, Chip On Board (COB), Ceramic Dual In-Line Package (CERDIP), Plastic Metric Quad Flat Pack (MQFP), Quad Flatpack (QFP), Small Outline Integrated Circuit (SOIC), Shrink Small Outline Package (SSOP), Thin Small Outline (TSOP), Thin Quad Flatpack (TQFP), System In Package (SIP), Multi Chip Package (MCP), Wafer-level Fabricated Package (WFP), Wafer-Level Processed Stack Package (WSP), and the like.

The flash memory devices and/or the memory controllers may constitute memory cards. In this case, the memory controllers may be constructed to communicate with an external device, for example a host using any one of various types of protocols including, for example, a Universal Serial Bus (USB), a Multi Media Card (MMC), a Peripheral Component Interconnect-Express (PCI-E), Serial Advanced Technology Attachment (SATA), Parallel ATA (PATA), Small Computer System Interface (SCSI), Enhanced Small Device Interface (ESDI), and Integrated Drive Electronics (IDE).

The flash memory devices may be non-volatile memory devices that can maintain stored data even when power is cut off. According to an increase in the use of mobile devices, for example a cellular phone, a personal digital assistant (PDA), a digital camera, a portable game console, and an MP3 player, the flash memory devices may be more widely used as data storage and code storage. The flash memory devices may be used in home applications, for example a high definition television (HDTV), a digital video disk (DVD), a router, and a Global Positioning System (GPS).

A computing system according to example embodiments may include a microprocessor that may be electrically connected with a bus, a user interface, a modem, and for example, a baseband chipset, a memory controller, and a flash memory device. The flash memory device may store N-bit data via the memory controller. The N-bit data may be processed by the microprocessor and N may be an integer equal to or greater than 1. When the computing system is a mobile apparatus, a battery may be additionally provided to supply operation voltage of the computing system.

It will be apparent to those of ordinary skill in the art that the computing system according to example embodiments may further include an application chipset, a camera image processor (CIS), a mobile Dynamic Random Access Memory (DRAM), and the like. The memory controller and the flash memory device may constitute a solid state drive/disk (SSD) that uses a non-volatile memory to store data.

Example embodiments having thus been described, it will be obvious that the same may be varied in many ways. Such variations are not to be regarded as a departure from the intended spirit and scope of example embodiments, and all such modifications as would be obvious to one skilled in the art are intended to be included within the scope of the following claims.

What is claimed is:

1. A memory apparatus comprising:
   a non-volatile memory device including a plurality of memory cells, the plurality of memory cells each including a floating gate and an insulating layer;
   one or more heating devices configured to contact with the non-volatile memory device and heat the non-volatile memory device; and
   a controller configured to control an operation of the one or more heating devices based on operational information of the non-volatile memory device.

2. The memory apparatus of claim 1, wherein the operational information is a number of times that the non-volatile memory device is erased, and
   the controller controls the one or more heating devices to heat the non-volatile memory device when the operational information is greater than or equal to a reference value.

3. The memory apparatus of claim 2, wherein the controller initializes the operational information after the one or more heating devices heat the non-volatile memory device.

4. The memory apparatus of claim 1, wherein the operational information is a change in a threshold voltage of one or more memory cells of the non-volatile memory device, and
   the controller monitors the change in the threshold voltage of the one or more memory cells of the non-volatile memory device to generate the operational information, and controls the at least one heating device to heat the non-volatile memory device when the operational information is greater than or equal to a reference value.

5. The memory apparatus of claim 1, wherein the controller performs error control code (ECC) decoding for data that is read from the non-volatile memory device, generates the operational information from an error rate of the ECC decoded data, and controls the one or more heating devices to heat the non-volatile memory device when the operational information is greater than or equal to a reference value.

6. The memory apparatus of claim 1, wherein at least one heating device, from among the one or more heating devices, is installed in each of one or more blocks of the non-volatile memory device, and the controller individually controls each of the installed heating devices.

7. The memory apparatus of claim 1, wherein the controller backs up data that is stored in the non-volatile memory device, before the one or more heating devices heat the non-volatile memory device.

8. The memory apparatus of claim 1, further comprising:

at least one cooling device configured to contact with the non-volatile memory device and cool the non-volatile memory device, wherein an operation of the at least one cooling device is controlled based on operational information of the non-volatile memory device.

9. The memory apparatus of claim 1, wherein the at least one heating device, from among the one or more heating devices, is an optical device that transfers heat to the non-volatile memory device.

10. The memory apparatus of claim 1, wherein the at least one heating device, from among the one or more heating devices, is a carbon nanotube that generates heat due to an electrical current.

11. A memory device heat treatment method of controlling a heating device contacting with a non-volatile memory device, the method comprising:

counting a number of times that the non-volatile memory device is erased and storing the counted number of times;

determining whether the counted number of times is greater than or equal to a reference value;

controlling the heating device to heat the non-volatile memory device when the counted number of times is greater than or equal to the reference value; and initializing the counted number of times after the heating device heats the non-volatile memory device.

12. The method of claim 11, further comprising:

monitoring a change in a threshold voltage of one or more memory cells of the non-volatile memory device to set the reference value.

13. A computer-readable recording medium storing a program for implementing the method according to claim 11.

* * * * *